United States Patent [19]
DePoorter et al.

[11] Patent Number: 5,578,866
[45] Date of Patent: Nov. 26, 1996

[54] METHOD OF MANUFACTURING A BLOCK-SHAPED SUPPORT BODY FOR A SEMICONDUCTOR COMPONENT

[75] Inventors: Johannes A. DePoorter; Rudolf P. Tijburg, both of Eindhoven; Hermanus A. Van De Pas, Wijchen, all of Netherlands

[73] Assignee: U.S. Philips Corporation, New York, N.Y.

[21] Appl. No.: 115,335

[22] Filed: Sep. 1, 1993

[30] Foreign Application Priority Data

Sep. 7, 1992 [EP] European Pat. Off. .............. 92202694

[51] Int. Cl.⁶ .................................................. H01L 23/544
[52] U.S. Cl. .............................. 257/620; 257/99; 437/51; 437/226; 437/905; 437/906
[58] Field of Search ..................................... 437/905, 906, 437/51, 226; 257/99, 620

[56] References Cited

U.S. PATENT DOCUMENTS

| 4,477,730 | 10/1984 | Fukuda et al. | 250/347 |
| 4,734,380 | 3/1988 | Tsang | 437/226 |
| 5,094,970 | 3/1992 | Yoshida et al. | 437/906 |

FOREIGN PATENT DOCUMENTS

| 59983 | 1/1984 | Japan . |
| 1014985 | 1/1989 | Japan . |
| 114985 | 1/1989 | Japan . |

Primary Examiner—J. Carroll
Attorney, Agent, or Firm—Ernestine C. Bartlett

[57] ABSTRACT

In the known method, a plate of a heat-conducting material, for example silicon, is subdivided by means of grooves into blocks which remain connected to one another along break-off edges. The plate is metallized on two sides and (locally) provided with layer-shaped regions comprising solder at the upper side, the diode laser being fastened within each region, after which the blocks are separated from one another by breaking-off. A disadvantage of this method is that the blocks thus obtained are not suitable for a final mounting in which the radiation beam of the diode laser is perpendicular to the carrier plate on which the support body is fastened. In a method according to the invention, mutually parallel grooves are provided in the plate and the plate is subdivided into strips whose longitudinal direction is perpendicular to the direction of the grooves which are at most two support bodies wide and whose side surfaces are substantially smooth and flat, and the upper surface and the side surfaces of the strips are provided with a conductive layer in one step, after which the layer-shaped regions comprising solder are provided on one of these surfaces. This method is simple, comprises comparatively few steps, and results in a large number of interconnected support bodies which are suitable for mounting with the support body tilted through 90°. This renders it possible to mount diode lasers on the support bodies before the latter are separated and to mount them finally relative to a carrier plate in such a way that the radiation beam is approximately perpendicular to the carrier plate. Preferably, strips having a width of exactly one support body are formed.

36 Claims, 3 Drawing Sheets

METHOD OF MANUFACTURING A BLOCK-SHAPED SUPPORT BODY FOR A SEMICONDUCTOR COMPONENT

FIELD OF THE INVENTION

The invention relates to a method of manufacturing a block-shaped support body for a semiconductor component, in particular a semiconductor diode laser, whereby in the upper side of a substantially plane plate mutually parallel grooves are formed between which the support bodies to be formed are present, the plate being provided with a conductive layer on which layer-shaped regions comprising solder are provided.

BACKGROUND OF THE INVENTION

Support bodies manufactured in this way and provided, for example, with a semiconductor diode laser are used, for example, as components of a read and/or write head of information-processing equipment such as laser printers, bar code readers, read and/or write devils for optical registration carriers such as CD (Audio) and CDROM (data) discs, and of systems for optical glass fibre communication. The support body then at the same time performs the function of heat sink for the diode laser.

A method of the kind mentioned in the opening paragraph is known from JP(A) 1-14985 published in Patent Abstracts of Japan, vol. 13, no. 195 CE-754) {3543}, $10^{th}$ May 1989. It is described therein how a plane heat-conducting silicon plate 1 is subdivided by grooves into blocks which comprise the support bodies to be formed and which remain connected to one another by means of break-off edges. A conductive layer 3 comprising titanium, platinum, and gold, is provided on the plate 1 and the lower side of the plate 1 is also metallized. Layer-shaped regions 5 with a solder comprising gold and tin are provided on the conductive layer on a block. The support bodies are removed from the plate 1 by breaking off.

A disadvantage of the known method is that the support bodies manufactured thereby are unsuitable for use in opto-electronic devices in which, for example, the radiation beam of the semiconductor diode laser mounted on the support body is substantially perpendicular to the carrier plate on which the support body is mounted, as is desirable for a number of applications. In fact, when the diode laser is placed on the upper surface of the support body, the support body must be tilted for this purpose. This involves the problem that the side faces of the support bodies are provided with a break-off edge, so that these side faces are not plane and smooth and accordingly unsuitable for mounting on a plane base surface. Removal of the break-off edges is difficult and in any case requires an additional process step in the known method, which contains comparatively many steps as it is. Fastening of the diode laser on a side surface of the support body is not a solution either because in that case the diode laser cannot be mounted on the support body until after these bodies have been separated from one another. Fastening, burning-in and testing of the diode lasers after mounting on the support bodies as a result becomes very inconvenient.

SUMMARY OF THE INVENTION

The present invention has for its object inter alia to provide a method of the kind mentioned in the opening paragraph whereby support bodies are obtained which can be tilted during mounting, while this method is simple and comprises few steps.

According to the invention, a method of the kind mentioned in the opening paragraph is for this purpose wherein, before or after the provision of the grooves, the plate is subdivided into strips which in lateral direction comprise at most two support bodies to be formed, which are perpendicular to the direction of the grooves, and whose side surfaces are substantially smooth and plane, the strips are provided with the conductive layer, and wherein the layer-shaped regions comprising solder are provided on an upper surface or a side surface of the strips. The subdivision of the plate into strips having substantially plane and smooth side surfaces renders these side surfaces suitable for mounting on a plane base surface. In addition, not only the upper surface but also the entire side surfaces of the strips are covered with the conductive layer when this layer is provided. As a result, the support body has two mutually approximately perpendicular, substantially smooth and plane surfaces provided with a conductive layer, both of which are suitable for mounting on a plane base surface. When the layer-shaped regions comprising solder are provided on the upper or side surface, the components to be mounted on the support bodies, for example semiconductor diode lasers, may already be fastened while the support bodies within the strip are still interconnected, which simplifies fastening, testing and measuring. Owing to the presence of the grooves perpendicular to the direction of the strips, the support bodies may be readily removed by breaking them off from the strips. Finally, the method according to the invention renders it possible to tilt the support bodies after their removal from the strips and provided with a semiconductor component, before they are fastened on a plane carrier plate. As a result, the active region of the components, for example corresponding to the radiation beam of the diode laser, is approximately perpendicular to the carrier plate after fastening of the support body to the carrier plate, which is desirable for various applications, as noted above. Since the strips are at most two support bodies wide, each support body has at least one such plane, smooth side surface provided with the conductive layer. When the strips are two support bodies wide, according to the invention, an additional groove is provided in the center of each strip in its longitudinal direction. The support bodies lying next to one another in lateral direction of the strip can then also be separated eventually by breaking them off. Suitable strips are formed, for example, by etching, but preferably by sawing. The provision of the conductive layer at the lower side of the plate may be omitted in view of the envisaged use of the support bodies, so that the method according to the invention is also comparatively simple.

In a preferred embodiment of a method according to the invention, the layer-shaped regions comprising solder are provided near a fin of the heat sinks to be formed, which fin runs parallel to the strips. As a result, a component fastened on the layer-shaped regions is present near the upper side of the support body after the support body has been tilted and mounted on the carrier plate by means of a plane, smooth and metallized surface. When this component is a semiconductor diode laser, this has the advantage that the upward-directed radiation be, am of the diode laser cannot reflect against the support body, which is an advantage in the applications mentioned above. When the strip is two heat sinks wide, the layer-shaped region with solder is preferably provided on the upper surface near the additional groove which runs in longitudinal direction.

An important modification of the preferred embodiment is characterized in that the strips comprise exactly one support body in lateral direction and the layershaped regions comprising solder are provided on the upper surface of the strips near an edge thereof. This method has several major advantages: first, no additional groove need be provided in longitudinal direction in the strips. Furthermore, each support body is thus given two parallel, plane, smooth side surfaces which are provided with the conductive layer. Owing to this symmetry, both the application of the regions comprising solder and the selection and manipulation of the individual support bodies become simpler. The layer-shaped regions comprising solder are preferably provided locally, i.e. in a region which is not much larger than the component to be fastened on the solder. The total quantity of solder is as small as possible for a given thickness as a result. Excess solder could become displaced, for example during soldering, to the component positioned on the support body and cause a short-circuit therein. A diode laser, for example, is preferably mounted upside-down, whereby the pn junction is only a few micrometers above the solder.

In a further modification of the method according to the invention, a mask is arranged over a number of strips positioned next to and against one another and already provided with the conductive layer, in which mask openings are present at the areas of fins of the support bodies to be formed running parallel to the strips, after which the layer-shaped regions comprising solder are provided, for example, by means of vapor deposition. This method has the advantage that a large number of strips is simultaneously provided with solder. In addition, solder is provided in locations where it is desired only, i.e. for example on the upper surface and near a fin extending parallel to the strips. The absence of excess solder is a further advantage, as explained above.

Preferably, a solder comprising indium is used in the method according to the invention. This has the advantage over, for example, a gold-fin solder that the components to be mounted on the support bodies, for example diode lasers, after being positioned on the layer-shaped region comprising solder stick somewhat to these regions. The transport of a strip of support bodies with diode lasers to a soldering oven can now take place more easily without the position of the diode lasers changing.

Various (semi)conductors or insulators may be chosen for the material of the support bodies, such as silicon or aluminum nitride. Preferably, the material chosen is silicon because it conducts heat satisfactorily and a standard technology is available for it. Low-ohmic silicon has the advantage that it conducts heat better and also contributes to the electrical conduction.

The mutually parallel grooves are preferably formed before the strips are formed, but it is also possible to form them afterwards. Both the grooves and the strips may be manufactured in a sawing machine, during which the platform on which the plane plate is present is rotated through 90° in between operations. For this reason the grooves are preferably formed before the conductive layer is provided. The conductive layer is preferably constructed as a double layer of titanium and platinum because this layer forms a very suitable base surface for a solder comprising indium and provides a satisfactory electrical contact with highly doped n-type silicon.

In a preferred embodiment of a method according to the invention, the individual support bodies are not removed from the strips by breaking until after a semiconductor component, for example a semiconductor diode laser, has been positioned and fastened on the layer-shaped regions comprising solder. The support bodies with, for example, diode lasers thereon may now be readily tested and burned-in because they are still present in the strips.

A support body manufactured by a method according to the invention is characterized by at least two mutually perpendicular, plane, smooth side surfaces which are provided with a conductive layer.

BRIEF DESCRIPTION OF THE DRAWINGS

The invention will now be explained in more detail with reference to an embodiment and the accompanying drawing in which.

The Figures are diagrammatic and not drawn to scale. Corresponding parts are usually given the same reference numerals in the various Figures.

DETAILED DESCRIPTION OF THE PREFERRED EMBODIMENTS

Figure 1:
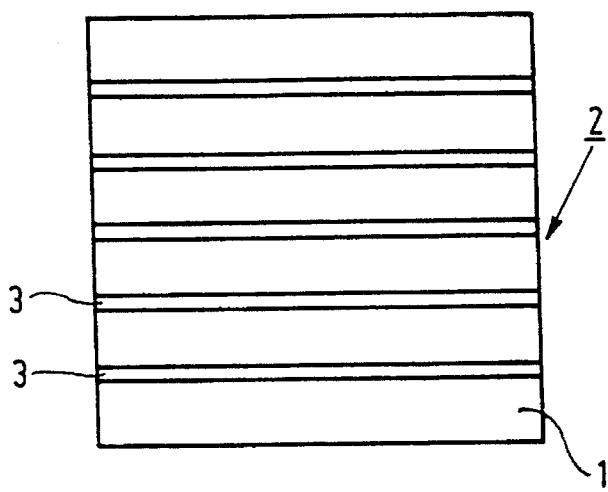
FIGS. 1 to 4 show an embodiment of a method according to the invention for the manufacture of a block-shaped support body for a diode laser, comprising a plan view of the support body in subsequent stages of manufacture and a perspective view of the support body.
Figure 2:
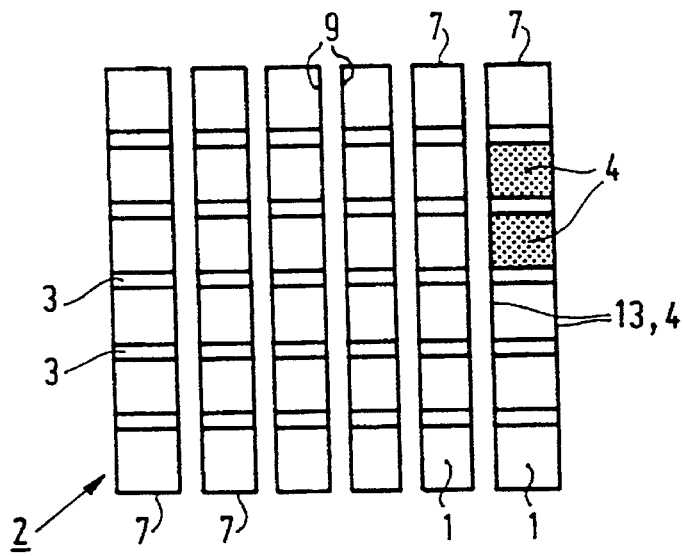
Figure 3:
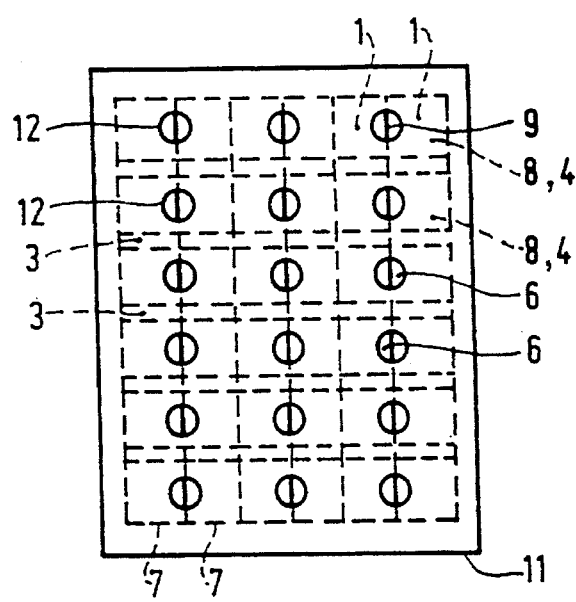
Figure 4:
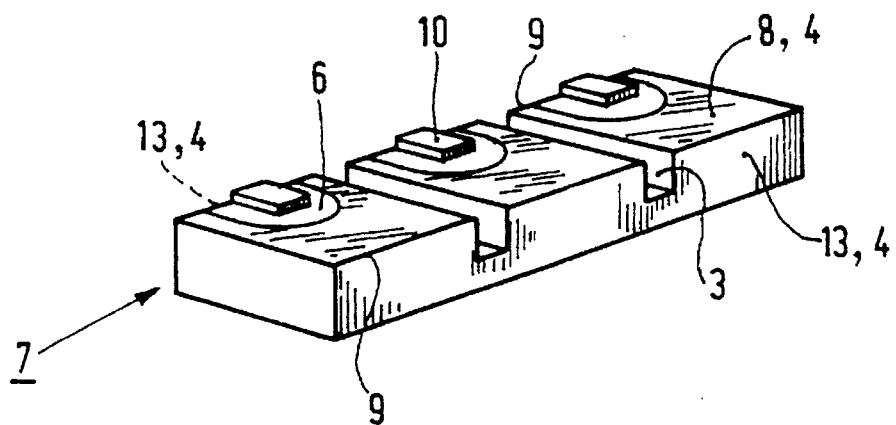

FIGS. 1 to 4 show an embodiment of a method according to the invention for the manufacture of a block-shaped support body shown in plan view and partly in perspective view in subsequent stages of manufacture. The method starts (see FIG. 1) with a plane plate 2, i.e. an n-type monocrystalline (001) silicon substrate with a resistivity of approximately 15 mΩcm and a thickness of 500μm in which grooves 3 are provided, for example by sawing, to a depth of approximately 450μm and a width of approximately 50μm. According to the invention (see FIG. 2), the plate 2 is subdivided into strips 7, here after the grooves 3 have been formed, the longitudinal direction of these strips being perpendicular to the direction of the grooves 3 which in lateral direction comprise at most two support bodies 1, preferably one support body 1, and which have substantially plane and smooth side surfaces 13, the strips 7 are provided with a conductive layer 4 which is provided by sputtering in this case and comprises a double layer of 200 nm titanium and 600 nm platinum. The grooves 3 are provided in this case before the strips 7 are formed. Preferably, the grooves 3 are provided before the conductive layer 4 is formed, as is the case in this example. When the conductive layer 4 is provided on the upper surface of the plate 2, the side surfaces 13 of the strips 7 are simultaneously covered with the conductive layer 4. The method according to the invention comprises comparatively few steps as a result, which is advantageous. Subsequently (see FIG. 3), also according to the invention, the layer-shaped regions 6 comprising solder are provided on the conductive layer 4 on an upper surface 8 or on a side surface 13 of the strips 7, preferably on the upper surface 8 near an edge 9 of the strips 7. As illustrated a number of strips 7 positioned next to and against one another and provided with the conductive layer 4 are covered by a mask 11 in which openings 12 are present at the areas of the edges 9 of the strips 7. The regions 6 comprising solder, with indium in this case, are provided by vapor deposition. The openings 12 in the present case are circular, so that the regions 6 have the shape of a semicircle. The openings 12 have a lateral interspacing of two support bodies 1, so that each support body 1 comprises exactly one region 6. As a result of this, and of the fact that the strips 7 lie closely against one another owing to a clamping device not shown in FIG. 3, substantially no excess solder is provided on the support bodies 1. This minimizes the risk of short-circuit arising during soldering. An important advantage of the method according to the invention is that a semiconductor component, for example a diode laser 10, can already be provided on each of the support bodies 1 (see Fig. 4) before their separation. The provision and subsequent testing and/or burning-in of the diode lasers 10 is considerably simplified by this. A very important advantage, finally, is that a support body 1 manufactured according to the invention has at least two mutually substantially perpendicular smooth, plane surfaces 8, 13 provided with the conductive layer 4, while the layer-shaped region 6 comprising solder is present on one of these surfaces, for example surface 8. This advantage is clarified with reference to FIG. 5.

Figure 5:
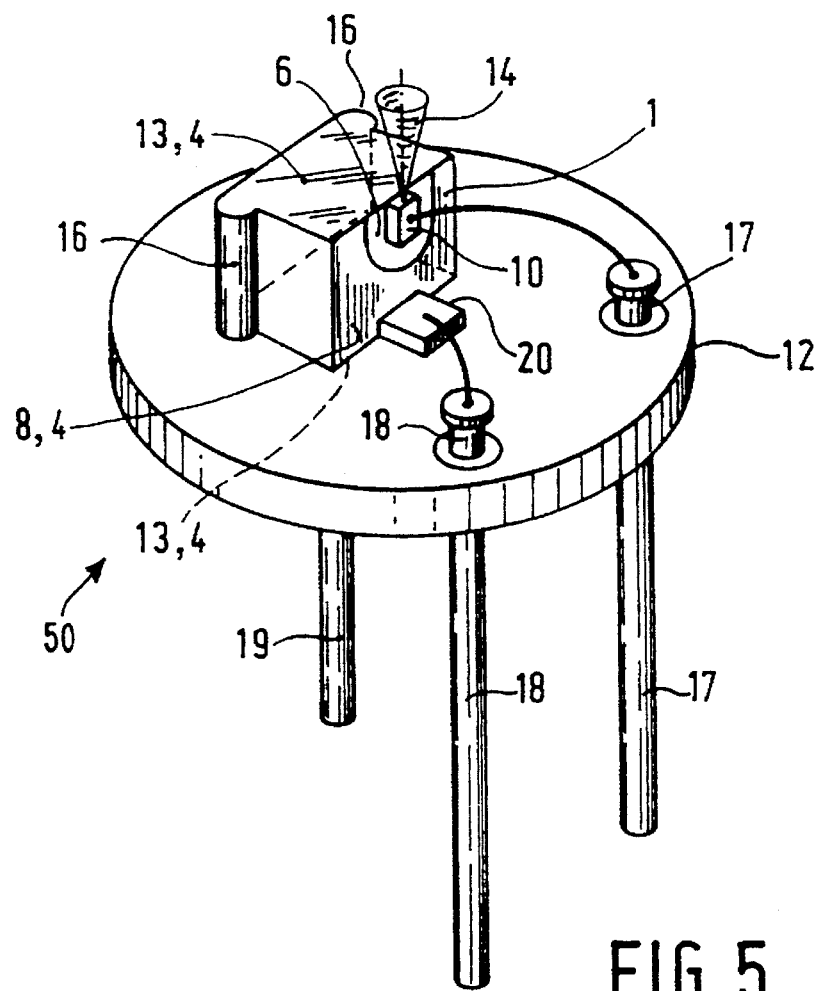
FIG. 5 shows in perspective view an optoelectronic device with a support body manufactured by a method according to the invention.
Figure 6:
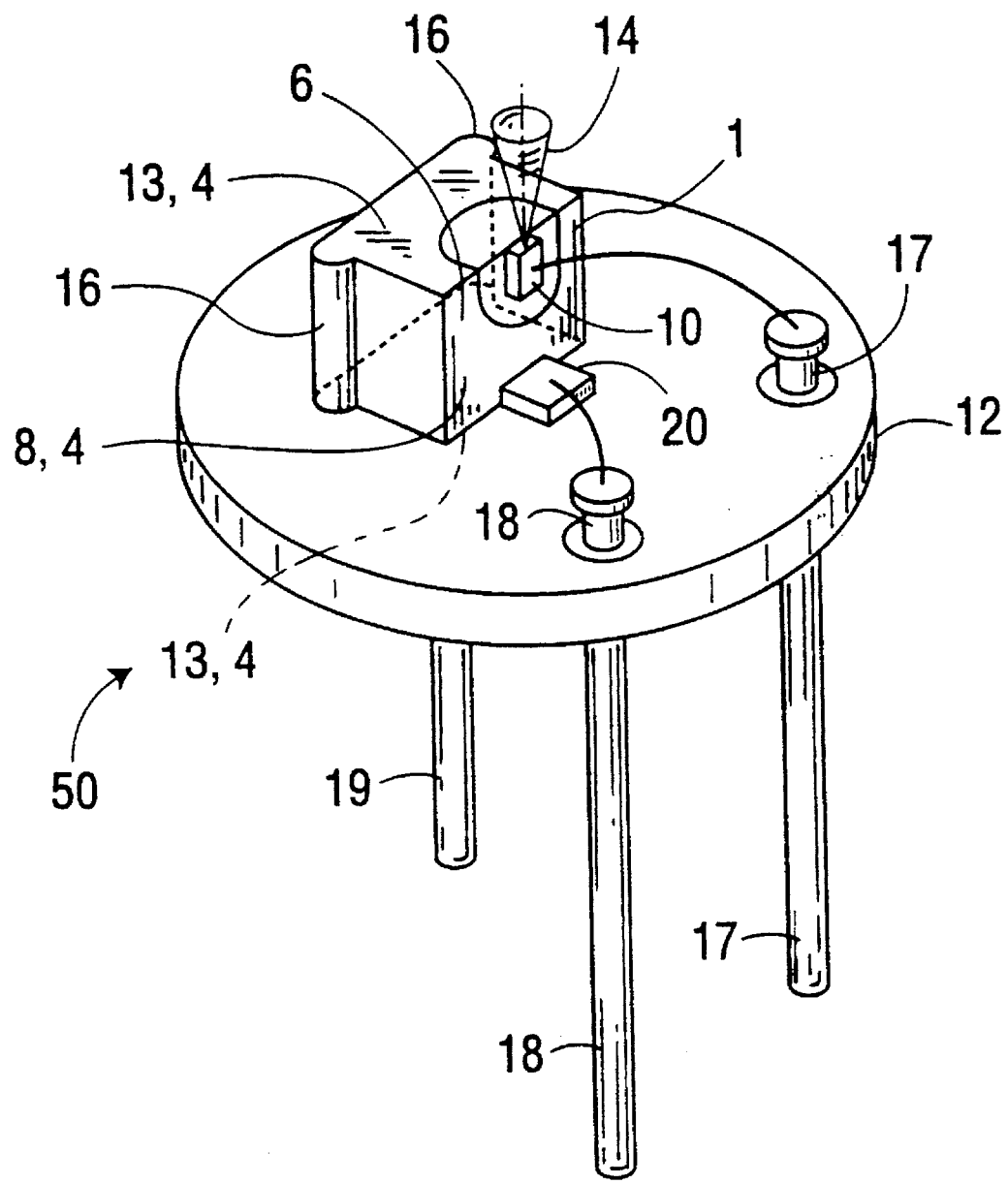
FIG. 6 shows in perspective view an alternative optoelectronic device with a support body manufactured by a method according to the invention.

FIGS. 5 and 6 are perspective views of optoelectronic devices 50 with a support body 1 manufactured by a method according to the invention. The support body 1 is fastened to a carrier plate 12 with a side surface 13 which is plane and smooth, and not provided with a break-off edge but provided with the conductive layer 4. The surface 8 with the region 6 within which the diode laser 10 is present is perpendicular to the carrier plate 12 here. As a result the radiation beams generated by the diode laser 10, of which only the beam 14 directed upwards is shown in FIG. 5, are also perpendicular to the carrier plate 12, which is desirable for many applications. Due to the presence of the mutually perpendicular, plane and smooth surfaces 8, 13 provided with the conductive layer, the diode laser 10 can be fastened on the one surface, for example the upper surface 8, while the support bodies 1 are still present in the strip 7 (see also Fig. 4), upon which the support bodies 1 can be tilted after the separation of the support bodies 1 by breaking-off and can be fastened on the plane carrier plate 12 with the other surface, the surface 10. This leads to the desired property, i.e. that the radiation beam 14 is substantially perpendicular to the carrier plate 12. Since the regions 6 comprising solder are provided near an edge 9 of the strip 7, the diode laser 10 in the device of FIG. 5 is near the upper side of the support body 1 and at least the upward-directed radiation beam 14 cannot be affected by reflection(s) against the support body 1. Such a construction is particularly suitable for use in, for example, the light pen of an optical read and/or write device. The support body 1 may be fastened on the carrier plate 12, for example, by soldering or gluing with an electrically conducting glue. When the support bodies 1 are broken from the strips 7, break-off edges 16 arise which, as FIG. 5 shows, cause no inconvenience. The diode laser 10 is electrically connected to the carrier plate 12 and a conductive pin 19 via the support body 1, and connected to a conductive pin 17 via a wire connection, which pin has an insulated lead-through. A so-called monitor diode 20 arranged below the diode laser 10 is connected to pin 19 and pin 18 and catches (part of) the downward-directed radiation beam coming from the diode laser 10.

The invention is not limited to the embodiment given, since many modifications and variations are possible to those skilled in the art within the scope of the invention. Thus, as noted above, strips may be formed which comprise two support bodies in lateral direction. In that case, an additional groove is to be provided in longitudinal direction within each strip. The layer-shaped regions comprising solder are provided at the upper side of the strips in that case, adjacent the fin adjoining the additional groove. In that case, also, the side surfaces of the support bodies situated in the walls of said groove are covered with the conductive layer and also with solder. Owing to the presence of the conductive layer, the solder present on these side surfaces is bound to a certain extent and displacement of this solder towards the diode laser on the support body remains within acceptable limits. Moreover, materials or compositions other than those mentioned in the embodiment may be used for, for example, the materials of the support bodies, the conductive layer, and the solder. Furthermore, alternative semiconductor components may be fastened on the support bodies instead of diode lasers. Thus photodiodes also have a preferred orientation as regards the direction of a radiation beam. The position of the active region within the photodiode also plays a part here. It is even conceivable that the tilting possibility offered is of advantage in the case of non-optoelectronic semiconductor components. Finally, it is noted that support bodies manufactured according to the invention need not necessarily be tilted. When the lower side is also provided with a conductive layer, or when the support body is electrically conducting, applications without tilting are also possible.

We claim:

1. A method of manufacturing a block-shaped support body (1), whereby in the upper side of a plane plate (2) of a heat-conducting material mutually parallel grooves (3) are formed between which the support bodies (1) to be formed are present, the plate (2) being provided with a conductive layer (4), while layer-shaped regions (6) comprising solder are provided on the conductive layer (4) near a fin (9) of the support bodies (1) to be formed, wherein, before or after the provision of the grooves, the plate (2) is subdivided into strips (7) which in lateral direction comprise at most two support bodies (1) to be formed, which are substantially perpendicular to the direction of the grooves (3), and whose side surfaces (13) are substantially smooth and plane, and wherein the strips (7) are provided with the conductive layer (4), and wherein the layer-shaped regions (6) comprising solder are provided on an upper surface (8) or a side surface (13) of the strips (7) by arranging a mask (11) over at least one strip positioned next to and against at least one other strip provided with the conductive layer (4), in which mask openings (12) are present where the layer-shaped regions (6) comprising solder are to be formed, after which the layer-shaped regions (6) comprising solder are provided.

2. A method as claimed in claim 1, characterized in that the layer-shaped regions (6) comprising solder are provided near a fin (9) of the support bodies (1) to be formed, which fin runs parallel to the strips (7).

3. A method as claimed in claim 1 or 2, characterized in that the strips (7) comprise exactly one support body (1) in lateral direction and the layer-shaped regions (6) comprising solder are provided on the upper surface (8) of the strips (7) near an edge (9) thereof.

4. A method as claimed in claim 1, characterized in that an indium region (6) is chosen for the layer-shaped region (6) comprising solder.

5. A method as claimed in claim 1, characterized in that silicon is chosen as the material of the plate (2).

6. A method as claimed in claim 5, characterized in that the silicon is low-ohmic silicon.

7. A method as claimed in claims 1, characterized in that the grooves (3) are formed before the conductive layer (4) is provided.

8. A method as claimed in claims 1, characterized in that the individual support bodies (1) are not removed from the strips (7) by breaking until after a semiconductor component (10) has been positioned and fastened on the layer-shaped regions (6) comprising solder.

9. A support body (1) manufactured by a method as claimed in Claim 1 and provided with at least two mutually perpendicular, plane, smooth surfaces (8,13) which are provided with a conductive layer (4) and a layer-shaped region (6) comprising solder.

10. A method as claimed in claim 2, wherein the strips (7) comprise exactly one support body (1) in lateral direction and the layer-shaped regions (6) comprising solder are provided on the upper surface (8) of the strips (7) near an edge (9) thereof.

11. A method as claimed in claim 2, wherein an indium region (6) is chosen for the layer-shaped region (6) comprising solder.

12. A method as claimed in claim 3, wherein an indium region (6) is chosen for the layer-shaped region (6) comprising solder.

13. A method as claimed in claim 2, wherein silicon is chosen as the material of the plate (2).

14. A method as claimed in claim 3, wherein silicon is chosen as the material of the plate (2).

15. A method as claimed in claim 4, wherein silicon is chosen as the material of the plate (2).

16. A method as claimed in claim 2, wherein the grooves (3) are formed before the conductive layer (4) is provided.

17. A method as claimed in claim 3, wherein the grooves (3) are formed before the conductive layer (4) is provided.

18. A method as claimed in claim 4, wherein the grooves (3) are formed before the conductive layer (4) is provided.

19. A method as claimed in claim 5, wherein the grooves (3) are formed before the conductive layer (4) is provided.

20. A method as claimed in claim 6, wherein the grooves (3) are formed before the conductive layer (4) is provided.

21. A method as claimed in claim 2, wherein the individual support bodies (1) are not removed from the strips (7) by breaking until after a semiconductor component (10) has been positioned and fastened on the layer-shaped regions (6) comprising solder.

22. A method as claimed in claim 3, wherein the individual support bodies (1) are not removed from the strips (7) by breaking until after a semiconductor component (10) has been positioned and fastened on the layer-shaped regions (6) comprising solder.

23. A method as claimed in claim 4, wherein the individual support bodies (1) are not removed from the strips (7) by breaking until after a semiconductor component (10) has been positioned and fastened on the layer-shaped regions (6) comprising solder.

24. A method as claimed in claim 5, wherein the individual support bodies (1) are not removed from the strips (7) by breaking until after a semiconductor component (10) has been positioned and fastened on the layer-shaped regions (6) comprising solder.

25. A method as claimed in claim 6, wherein the individual support bodies (1) are not removed from the strips (7) by breaking until after a semiconductor component (10) has been positioned and fastened on the layer-shaped regions (6) comprising solder.

26. A method as claimed in claim 7, wherein the individual support bodies (1) are not removed from the strips (7) by breaking until after a semiconductor component (10) has been positioned and fastened on the layer-shaped regions (6) comprising solder.

27. A method of manufacturing a support body which comprises:

forming mutually parallel grooves in the upper side of a plane plate of a heat-conducting material between which the support bodies are to be formed;

providing said plate with a conductive layer;

before or after the provision of the grooves, subdividing the plate into strips which in lateral direction comprise at most two support bodies to be formed, which are substantially perpendicular to the direction of the grooves, and whose side surfaces are substantially smooth and plane, and which are provided with a conductive layer;

and providing regions comprising solder on at least an upper surface or a side surface of the strips by arranging a mask over at least one strip positioned next to and against at least one other strip provided with said conductive layer, said mask having openings present where the regions comprising solder are to be formed, after which solder is applied through the openings to form said regions comprising solder.

28. A method as claimed in claim 27 in which said mask openings are present at the area of fins of the support bodies to be formed running parallel to the strips.

29. A method as claimed in claim 28 in which the regions comprising solder are formed by vapor deposition through said mask openings.

30. A method as claimed in claim 29 wherein said solder comprises indium.

31. A method as claimed in claim 27 wherein said conductive layer is a double layer of titanium and platinum.

32. A method as claimed in claim 31 wherein said region comprising solder has an optoelectronic component attached thereto.

33. A method as claimed in claim 31 wherein said component is a diode laser.

34. A method of manufacturing a support body which comprises:

forming mutually parallel grooves in the upper side of a plane plate of an n-type silicon substrate between which the support bodies are to be formed;

providing said plate with a conductive layer comprising a double layer of titanium and platinum;

before or after the provision of the grooves, subdividing the plate into strips which in lateral direction comprise at most two support bodies to be formed, which are substantially perpendicular to the direction of the grooves, and whose side surfaces are substantially smooth and plane, and which are provided with said conductive layer;

and providing regions comprising indium solder on at least an upper surface or a side surface of the strips by arranging a mask over at least one strip positioned next to and against at least one other strip provided with said conductive layer, said mask having openings present where the regions comprising solder are to be formed, after which solder is applied through the openings to form said regions comprising solder.

35. A method as claimed in claim 34 wherein said region comprising solder has an optoelectronic component attached thereto.

36. A method as claimed in claim 35 wherein said component is a diode laser.

* * * * *